United States Patent [19]
Kobayashi

[11] Patent Number: 5,736,779
[45] Date of Patent: Apr. 7, 1998

[54] SEMICONDUCTOR DEVICE WITH ZENER DIODE FOR GATE PROTECTION, AND METHOD FOR FABRICATING THE SAME

[75] Inventor: Kenya Kobayashi, Tokyo, Japan

[73] Assignee: NEC Corporation, Tokyo, Japan

[21] Appl. No.: 681,960

[22] Filed: Jul. 30, 1996

[30] Foreign Application Priority Data

Jul. 31, 1995 [JP] Japan ............................. 7-194717

[51] Int. Cl.$^6$ ............................................. H01L 23/62
[52] U.S. Cl. .......................... 257/603; 257/355; 257/356; 257/357; 257/360
[58] Field of Search ............................ 257/288, 297, 257/350, 355, 359, 360, 376, 377, 394, 398, 399, 400, 603, 604, 605; 347/904

[56] References Cited

U.S. PATENT DOCUMENTS 5,536,958  7/1996  Shen et al. ............................. 257/356

FOREIGN PATENT DOCUMENTS 1-8674   1/1989  Japan .
5-21721  1/1993  Japan .

*Primary Examiner*—Tom Thomas
*Assistant Examiner*—Fetsum Abraham
*Attorney, Agent, or Firm*—Sughrue, Mion, Zinn, Macpeak & Seas, PLLC

[57] ABSTRACT

A semiconductor device has a Zener diode disposed between a gate and a source of a MOS type semiconductor device. The Zener diode is structured as $N^+/P/P^+/P/N^+$. The $P^+$ region functions as a channel stopper, and suppresses the occurrence of leakage current caused by an inversion of a surface of the low concentration P region. The adjustment of the width of the $P^+$ region enables the controlling of a Zener voltage. The Zener diode protects the gate, and the arrangement enables the prevention of the occurrence of leakage current between the gate and the source.

9 Claims, 6 Drawing Sheets

SEMICONDUCTOR DEVICE WITH ZENER DIODE FOR GATE PROTECTION, AND METHOD FOR FABRICATING THE SAME

BACKGROUND OF THE INVENTION (1) Field of the Invention

The present invention relates to a semiconductor device and a method for fabricating the same, and more particularly to a gate protection device of a MOS type semiconductor device and a method for fabricating the same.

(2) Description of the Related Art

Research and development is being made for a protection circuit to be integrated between a source and a gate of a power MOSFET, among MOS type semiconductor devices, which is used for a switching element of a comparatively high voltage/large current for purposes of preventing the breakdown of the element caused by overvoltage and static electricity.

In a conventional power MOSFET, a Zener diode 200 is connected between a gate G and a source S of an N-channel power MOSFET 100 as a protective element as shown in FIG. 1. The specific arrangement thereof is shown in FIG. 2. As shown in FIG. 2, the power MOSFET is structured as a vertical double diffusion MOSFET (vertical DMOSFET) in which an N-type epitaxial layer 2 is stacked on an $N^+$-type substrate 1 to become a drain electrode D, a P-type base diffusion layer 10 is formed in a part of a surface of the epitaxial layer 2, an $N^+$-type source diffusion layer 14 is formed in a part of the surface of the P-type base diffusion layer 10, a gate polysilicon 9 is formed thereabove with a gate insulating film 6 being interposed, and an aluminum interconnect 18 separated from the gate polysilicon 9 by an interlayer insulating film 16 is provided as a source electrode S.

Also, an insulating film 3 is formed in a part of the surface of the epitaxial layer 2 and, on this insulating film 3, there is provided a polysilicon Zener diode 120 which is constituted by an $N^+$-type polysilicon 15 and a P-type polysilicon 11 connected in series in a reverse direction and which is disposed between the gate and the source. The polysilicon Zener diode 120 is designed such that a Zener breakdown occurs at a voltage lower than the breakdown voltage of the gate insulating film 6. A P-type diffusion layer 5 is a guard ring, the numeral 12 depicts a $P^+$-type diffusion layer, and the numeral 17 depicts a contact hole.

Examples of gate protection circuits of the kind explained above have been disclosed in Japanese Patent Application Kokai Publication Nos. Sho 64-8674 and Hei 5-21721. FIG. 3 is a sectional view showing a vertical power MOSFET disclosed in the Japanese Patent Application Kokai Publication No. Sho 64-8674. The power MOSFET shown in FIG. 3 is structured as a vertical double diffusion MOSFET (vertical DMOSFET) in which an N-type epitaxial layer 102 is stacked on an $N^+$-type substrate 101 to become a drain electrode D, a P-type base diffusion layer 10 is formed in a part of a surface of the epitaxial layer 102, an $N^+$-type source diffusion layer 14 is formed in a part of the surface of the P-type base diffusion layer 10, a gate polysilicon 9 is formed thereabove with a gate insulating film 6 being interposed, and an aluminum interconnect 18 separated from the gate polysilicon 9 by an interlayer insulating film 16 is provided as a source electrode S.

Further, on a surface of the P-type diffusion layer 103 formed using the same process as for the P-type base diffusion layer 10, there are formed a $P^+$-type diffusion layer 104 and $N^+$-type diffusion layers 105, and the two $N^+$-type diffusion layers 105 having the $P^+$-type diffusion layer 104 interposed therebetween are respectively connected to the gate electrode G and the source electrode S by aluminum interconnects 18. Here, the P-type diffusion layer 103, the $P^+$-type diffusion layer 104 and the $N^+$-type diffusion layer 105 constitute the Zener diode connected in series in a reverse direction.

FIG. 4 shows a lateral power MOSFET disclosed in the Japanese Patent Application Kokai Publication No. Hei 5-21721. The power MOSFET shown in FIG. 4 is structured as a lateral double diffusion MOSFET (lateral DMOSFET) in which a P-type base diffusion layer 10 is formed in a part of an N-type substrate 201, $N^+$-type source diffusion layers 14 are formed in a part of the surface of the P-type base diffusion layer 10, gate polysilicon 9 is formed thereabove with a gate insulating film 6 being interposed. An $N^+$-type drain diffusion layer 204 is also formed in a part of the surface of the N-type substrate 201. Further, a first aluminum interconnect 206 separated from the gate polysilicon 9 by a first interlayer insulating film 205, is provided as a source electrode S, and second aluminum interconnects 208 separated from the first aluminum interconnect 206 by a second interlayer insulating films 207 are provided as a drain electrode D and a gate electrode G.

Also, over a part of the N-type substrate 201, a polysilicon Zener diode 209 is formed with an insulating film 202 interposed therebetween. The polysilicon Zener diode 209 is structured such that $P^+$ regions, in which a number of cell-like regions are regularly arranged, are provided within the $N^+$ region, and the interconnects for this structure to be used as a bidirectional Zener diode between the gate and the source are provided.

In the conventional example shown in FIG. 2, there is a problem that, since the P-type polysilicon in the polysilicon Zener diode 20 is formed during the same process used for the formation of the MOSFET P-type base diffusion layer 10, the impurity concentration thereof is comparatively low and, depending on the fabrication steps used subsequent to the formation of the polysilicon Zener diode, such as for forming interlayer insulating films, interconnects, cover films and mold resin layers, the surface of the $P^+$-type polysilicon region is prone to be inverted resulting in the occurrence of leakage current between the gate and the source.

In the conventional example shown in FIG. 3, there is a problem in that, since the Zener diode is formed using the diffusion layer, in case the P-type diffusion layer 103 and the $N^+$-type diffusion layer 105 are forward-biased, minority carriers are injected to the N-type epitaxial layer 102, leading to the likelihood of occurrence of latch-up or malfunction.

In the conventional example shown in FIG. 4, there is a problem that, since each of the impurity concentrations for the $N^+$ and $P^+$ regions in the polysilicon Zener diode 209 must be selected according to the Zener voltage required, it is necessary to add to the process for the formation of the MOSFET a process for the formation of the Zener diode, thus resulting in an increase in the manufacturing cost.

It may be possible to form the $N^+$ and $P^+$ regions in the polysilicon Zener diode 209 by using the same process as that for the formation of the MOSFET but, in such a case, the concentration of each of the $N^+$ and $P^+$ regions is subject to limitations by processes, resulting in a failure to obtain the necessary Zener voltage.

SUMMARY OF THE INVENTION

An object of the invention, therefore, is to overcome the problems existing in the prior art, and to provide a semiconductor device having a gate protection polysilicon Zener diode which is capable of preventing the occurrence of leakage current between the gate and the source and also capable of controlling the Zener diode voltage as necessary, and to provide a method for fabricating the same.

According to one aspect of the invention, there is provided a semiconductor device having a Zener diode which is disposed between a gate and a source of a MOS type semiconductor device and which is for protecting the gate, the semiconductor device comprising:

a series of semiconductor junction structures having different impurity concentrations; and a channel stopper disposed in the series of semiconductor junction structures, the channel stopper being for suppressing the occurrence of a leakage current caused by an inversion of a surface of a low concentration region.

According to another aspect of the invention, there is provided a method for fabricating a semiconductor device in which a Zener diode is connected between a gate and a source of a MOS type semiconductor device, the method comprising the steps of:

forming an epitaxial layer at a Zener diode formation region on a semiconductor substrate;

forming an conductive layer by forming a diffusion layer on the epitaxial layer, the conductive layer being formed over the diffusion layer with an insulating layer being interposed;

forming a low concentration semiconductor region by converting the conductive layer;

forming a first high concentration semiconductor region at a portion of the low concentration semiconductor region converted from the conductive layer, the first high concentration semiconductor region partitioning the low concentration semiconductor region; and forming, adjacent to the low concentration semiconductor region, a second high concentration semiconductor region having a conductivity type different from that of the low concentration semiconductor region, thus forming junction structures with different concentrations.

According to the invention, by providing the semiconductor junction structures in which the impurity concentrations are different and which constitute a Zener diode connected between the gate and the source for protecting the gate in the MOSFET, that is, specifically, by providing an $N^+/P/P^+/P/N^+$ structure, it is made possible for the $P^+$ region to prevent the occurrence of the leakage current caused by inversion of the surface of the P region, and made possible to readily control the Zener voltage by adjusting the width of the $P^+$ region.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1:
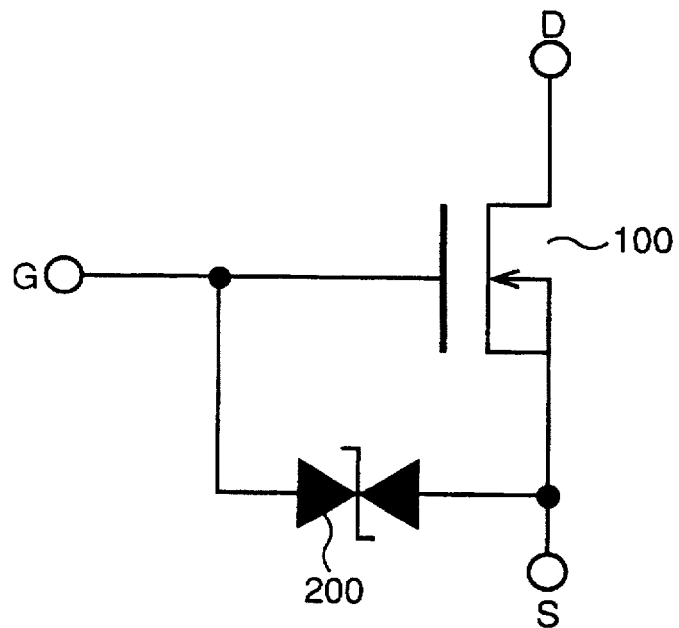
FIG. 1 is a circuit diagram showing a conventional MOSFET having a gate protection circuit.
Figure 2:
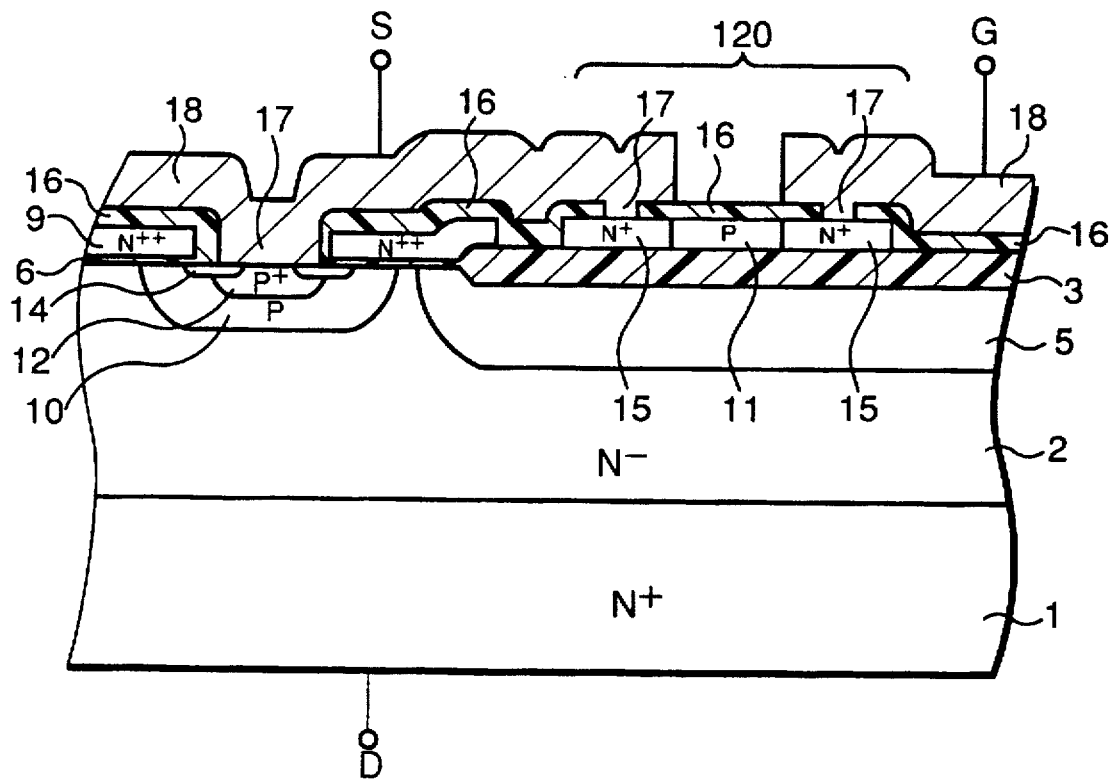
FIG. 2 is a sectional view showing a conventional semiconductor device.
Figure 3:
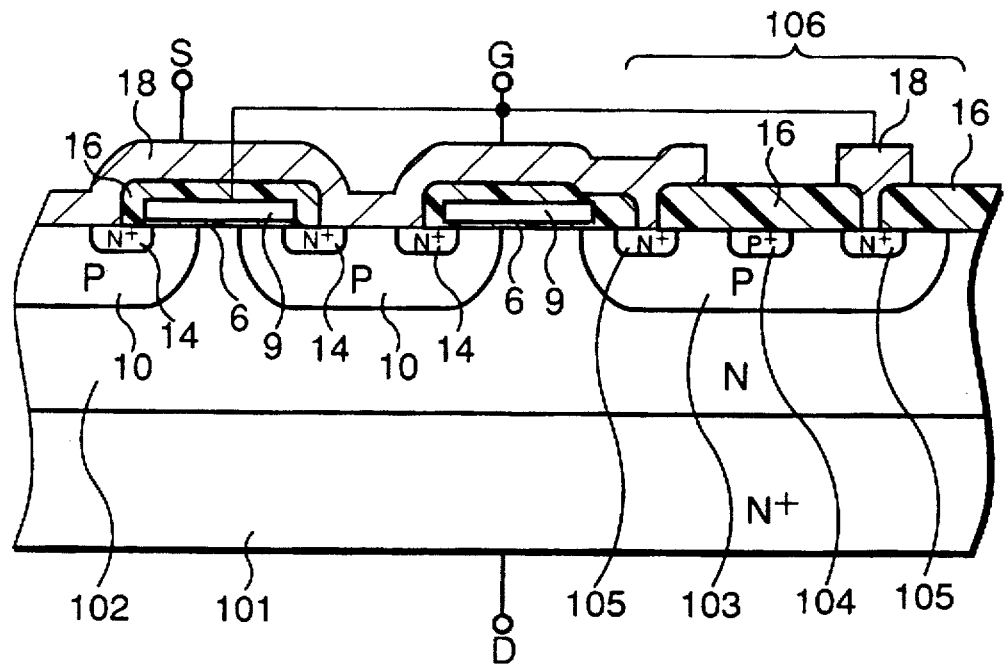
FIG. 3 is a sectional view showing another conventional semiconductor device.
Figure 4:
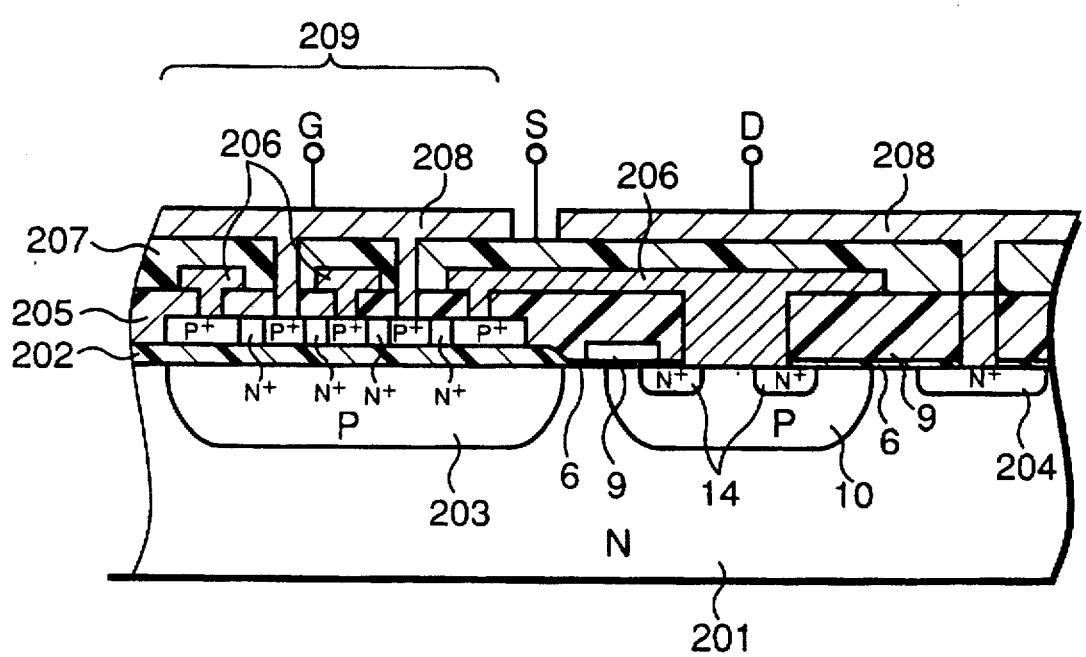
FIG. 4 is a sectional view showing still another conventional semiconductor device.
Figure 5:
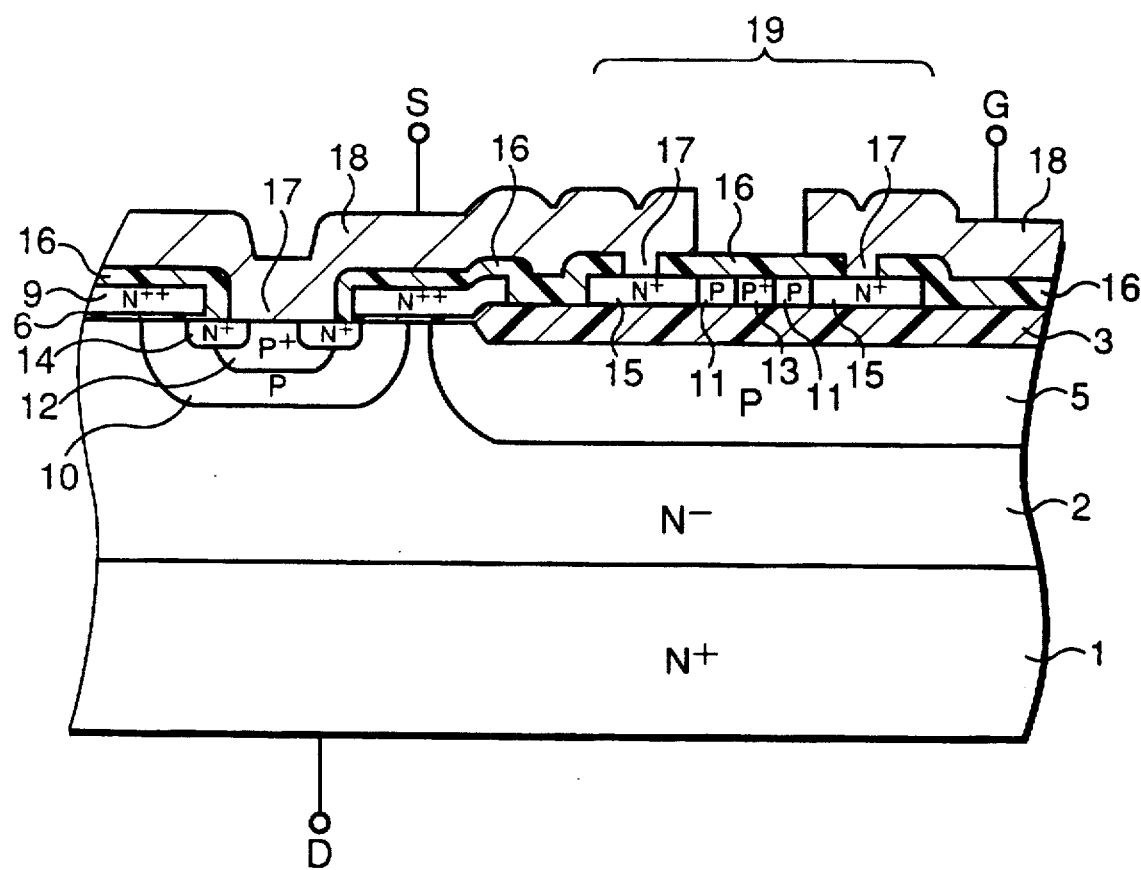
FIG. 5 is a sectional view showing a semiconductor device of a first embodiment according to the invention.

The present invention relates to the semiconductor device that has a Zener diode 19 as shown in FIG. 5.

The Zener diode 19 is one which is constituted by junction structures having different impurity concentrations and is connected between the gate electrode G and the source electrode S for protecting the gate electrode G of a MOS type semiconductor device, and in which the semiconductor junction structures 11 and 15 have a channel stopper 13 serving to suppress the occurrence of the leakage current caused by the inversion of the surface of the low concentration region 11. "D" in the drawings depicts a drain electrode in the MOS type semiconductor device.

More specifically, the channel stopper 13 is constituted by a high concentration semiconductor 13, and is provided within the low concentration region 11 in the semiconductor junction structures 11 and 15. The channel stopper 13 partitions the low concentration region 11.

Figure 7:
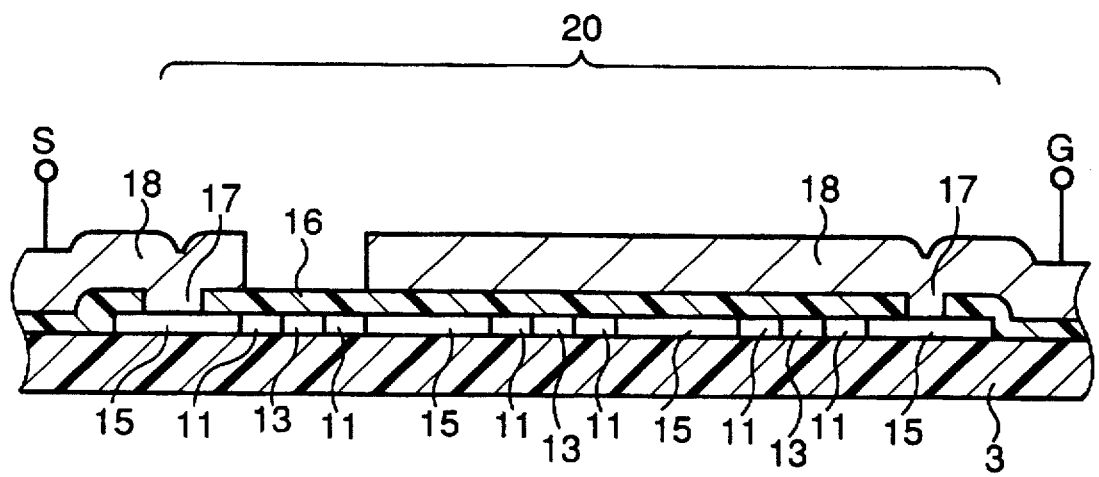
FIG. 7 is a sectional view showing a portion of a semiconductor device of a second embodiment according to the invention.

Also, the Zener diode 19 is one which has the channel stopper 13, which is formed by the semiconductor regions 11 and 15 having different impurity concentrations as a series of junctions on the insulating film 3, and in which the Zener voltage of the Zener diode 19 is controlled by the impurity concentrations of the low concentration side semiconductor region 11, or is controlled by the dimension of the width of the channel stopper 13. As shown in FIG. 7, the Zener diode 19 may be in the form of a Zener diode group 20 in which a plurality of stages of diodes are connected in series.

Next, the method for fabricating a semiconductor device according to the invention includes processes for forming an epitaxial layer, for forming an conductive layer, for forming a low concentration semiconductor, for forming a high concentration semiconductor, and for making junctions. The Zener diode 19 is connected between the gate electrode G and the source electrode S of the MOS type semiconductor device.

Figure 6A:
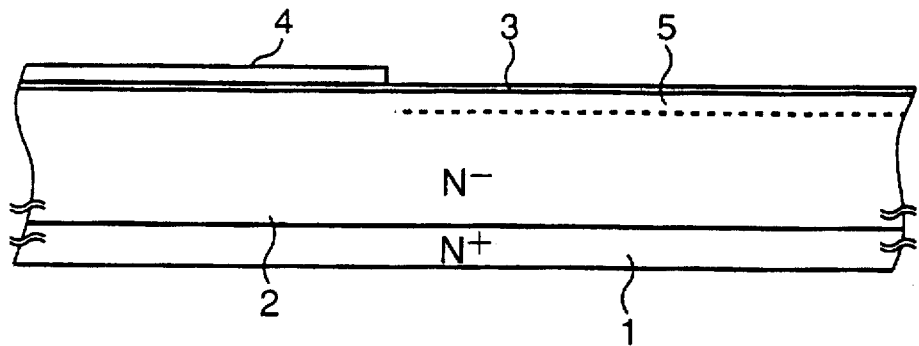
FIGS. 6A to 6G are sectional views of the semiconductor device of the first embodiment for use in explaining sequential process steps for fabricating the same.

Now, the function of each of the processes is explained. As shown in FIG. 6A, the process for the formation of an epitaxial layer 2 is a process in which the epitaxial layer 2 is formed in the semiconductor substrate 1 at its region where the Zener diode 19 is provided and, as shown in FIGS. 6C and 6D, the process for the formation of an conductive layer is a process in which the diffusion layer 5 is formed in the epitaxial layer 2 and the conductive layer 7 is formed over the diffusion layer 5 with the insulating film 3 being interposed.

Figure 6B:
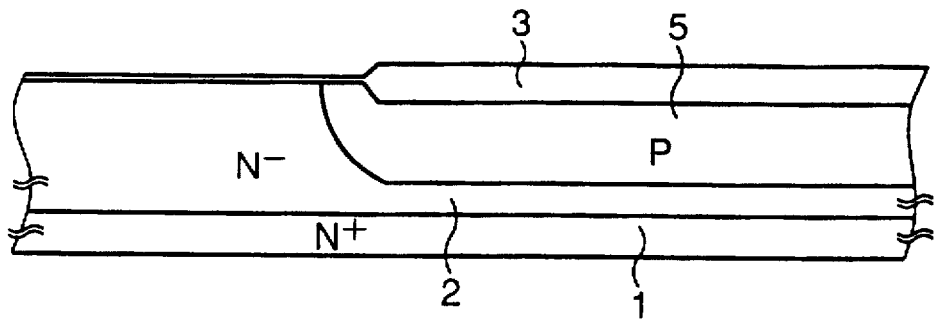
Figure 6C:
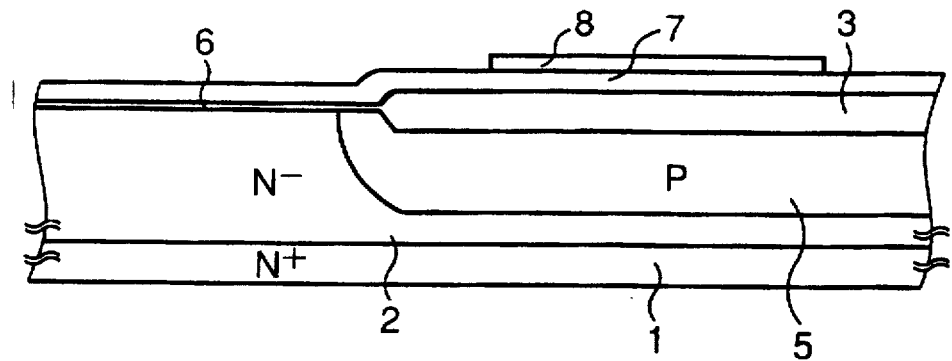
Figure 6D:
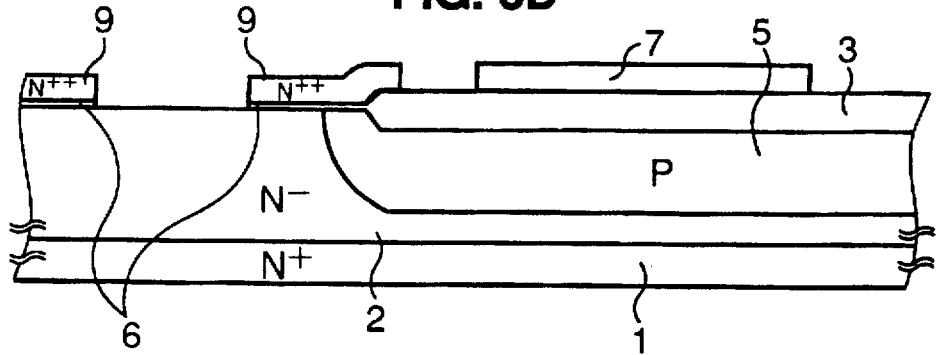
Figure 6E:
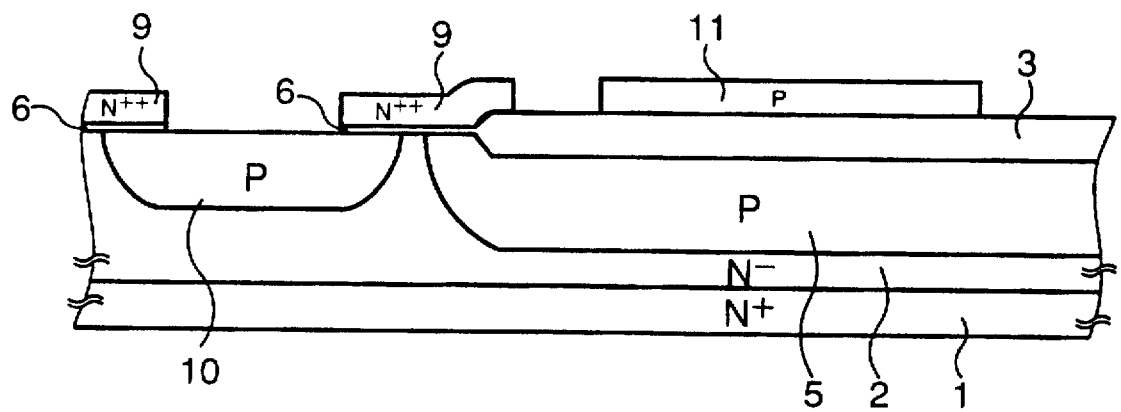
Figure 6F:
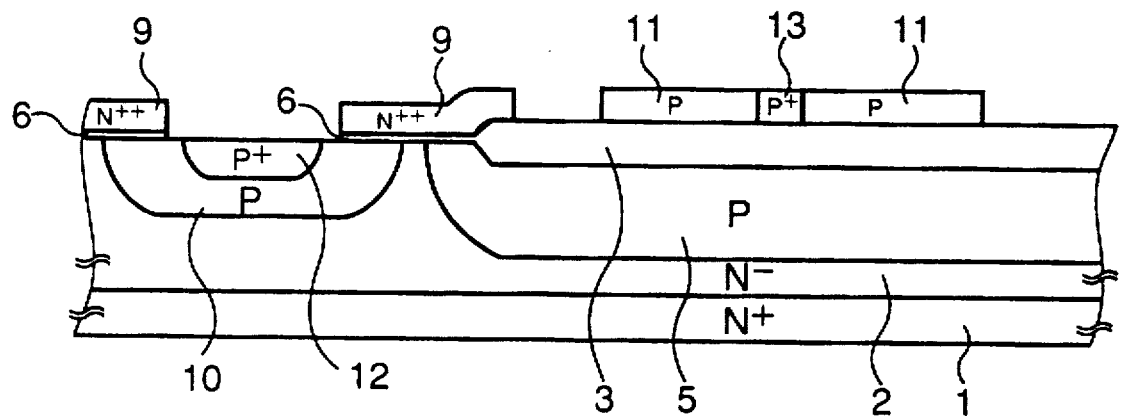
Figure 6G:
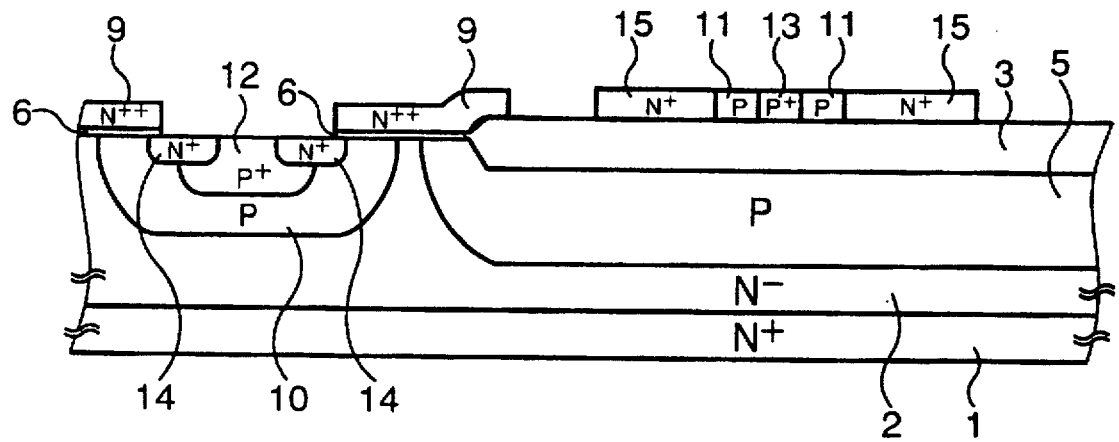

Further, the process for the formation of a low concentration semiconductor is a process in which the conductive layer 7 is converted to the low concentration semiconductor 11 shown in FIG. 6E, and the process for the formation of a high concentration semiconductor is a process in which the high concentration semiconductor region (P⁺) 13 is formed in a part of the low concentration semiconductor region (P) 11 converted within the conductive layer 7 as shown in FIG. 6F, and the low concentration semiconductor region (P) 11 is partitioned by the high concentration semiconductor region (P⁺) 13. The process for forming junction structures is a process in which, adjacent to the partitioned low concentration semiconductor region (P) 11, the high concentration semiconductor region (N⁺) 15 of a different conductivity type is formed, whereby the junction structures (N⁺/P/P⁺/P/N⁺ junctions) having different concentrations 11, 13 and 15 are formed as shown in FIG. 6G.

The processes for the formation of the low concentration semiconductor and the high concentration semiconductor and the process for making the junctions are carried out at each stage of the formation of the three layered structure of diffusion layers 10, 12 and 14 constituting the MOS type semiconductor device in which the Zener diode 19 is connected between the gate electrode G and the source electrode S.

Now, a first embodiment of the invention is explained with reference to FIG. 5 and FIGS. 6A to 6G. FIG. 5 is a sectional view showing a semiconductor device of the first embodiment, and FIGS. 6A to 6G are sectional views of the semiconductor device for use in explaining sequential steps of the method for fabricating the semiconductor device according to the invention.

The semiconductor device of the first embodiment shown in FIG. 5 is structured as a vertical double diffusion MOS-FET (vertical DMOSFET) in which an N-type epitaxial layer 2 is stacked on an N⁺-type substrate 1 to become a drain electrode D, a P-type base diffusion layer 10 is formed in a part of a surface of the epitaxial layer 2, an N⁺-type source diffusion layer 12 is formed in a part of the surface of the P-type base diffusion layer 10, a gate polysilicon 9 is formed thereabove with a gate insulating film 6 being interposed, and an aluminum interconnect 18 separated from the gate polysilicon 9 by an interlayer insulating film 16 is provided as a source electrode S.

Further, the P-type base diffusion layer 5 is formed during the same process used for the P-type base diffusion layer 10 and, over a surface of the P-type diffusion layer 5, a P-type diffusion layer 11 and an N⁺-type diffusion layers 15 and 15 are formed with the insulating layer 3 interposed, and the P⁺-type diffusion layer 13 is formed in the P-type diffusion layer 11 so as to divide it into the P-type diffusion layers 11 and 11. The two N⁺-type diffusion layers 15 and 15 are connected respectively to the gate electrode G and the source electrode S by the aluminum interconnects 18. Here, the P-type diffusion layers 11 and 11, the P⁺-type diffusion layer 13 and the N⁺-type diffusion layers 15 and 15 constitute the Zener diode connected in series in a reverse direction.

Next, the method for fabricating the semiconductor device shown in FIG. 5 is explained with reference to FIGS. 6A to 6G. The N⁺-type substrate 1 is prepared by introducing thereto, for example, antimony or arsenic on the order of $10^{18}$–$10^{19}$ cm⁻³ and, on the main surface thereof, the N⁻-type epitaxial layer 2 is formed by introducing thereto, for example, phosphorus on the order of $10^{14}$–$10^{16}$ cm⁻³ with the concentration and the thickness necessary for the required breakdown voltage for the vertical type power MOSFET formed later. Next, as shown in FIG. 6A, the insulating film 3 of, for example, $SiO_2$, is formed by a thermal oxidation process uniformly on a surface of the N⁻-type epitaxial layer 2 provided on the N⁺-type substrate 1, followed by the formation of the insulating film 4 of, for example, $Si_3N_4$, by a CVD process, and a part of the insulating film 4 is etched away by a photolithography process after the patterning thereof. Then, for forming the P-type diffusion layer 5, boron is diffused by an ion implantation process using the insulating film 4 as a mask.

The insulating film 3, shown in FIG. 6B, formed by a LOCOS process, has a thickness on the order of 1 μm. After the insulating film 4 and a thin portion of the insulating film 3 are etched away, a P-type diffusion layer 5 is diffused-in by a thermal process.

The gate insulating film 6, as shown in FIG. 6C, is uniformly formed by, for example, a thermal oxidation process, and further a polysilicon layer 7 is uniformly formed by a CVD process. Following this, an insulating film 8 is formed by, for example, a thermal oxidation process, and patterning is carried out by a photolithography process so that the insulating film 8 is left in place as a mask material only at the polysilicon Zener diode formation region.

Next, after the phosphorus is diffused to a high concentration for making the polysilicon layer 7 to be of a low resistance, the patterning is carried out again by using the insulating film 8 as a mask, thus forming the gate polysilicon layer 9 as shown in FIG. 6D.

Then, as shown in FIG. 6E, a P-type base diffusion layer 10 and a P-type polysilicon 11 are formed by introducing boron by an ion-implantation process and a thermal process.

Next, as shown in FIG. 6F, a P⁺-type diffusion layer 12 and a P⁺-type polysilicon 13 are formed by introducing boron in a comparatively high dose after the patterning of the photoresist.

Thereafter, as shown in FIG. 6G, an N⁺-type diffusion layer 14 and an N⁺-type polysilicon 15 are formed by introducing phosphorus or arsenic in a comparatively high dose after the patterning of the photoresist.

The above explained processes result in the formation of the N-channel vertical DMOSFET and the polysilicon Zener diode having an N⁺/P/P⁺/P/N⁺ structure. After carrying out the necessary patterning, the interlayer insulating film 16, the contact hole 17, and the aluminum interconnects 18 are formed, and this provides a power MOSFET in which the polysilicon Zener diode 19 is connected between the gate and the source as shown in FIG. 5.

Next, a second embodiment of the invention is explained with reference to a partial sectional view of FIG. 7. The semiconductor device shown in FIG. 7 is fabricated through the same processes as those for the first embodiment explained with reference to FIGS. 6A to 6G.

As shown in FIG. 7, the polysilicon Zener diode 20 having three stage of N⁺/P/P⁺/P/N⁺ structures are connected in series. In the arrangement of the semiconductor device shown in FIG. 7, the Zener breakdown is more abrupt in the second stage than the first stage and is more abrupt in the third stage than the second stage resulting in a faster protection performance.

Figure 8:
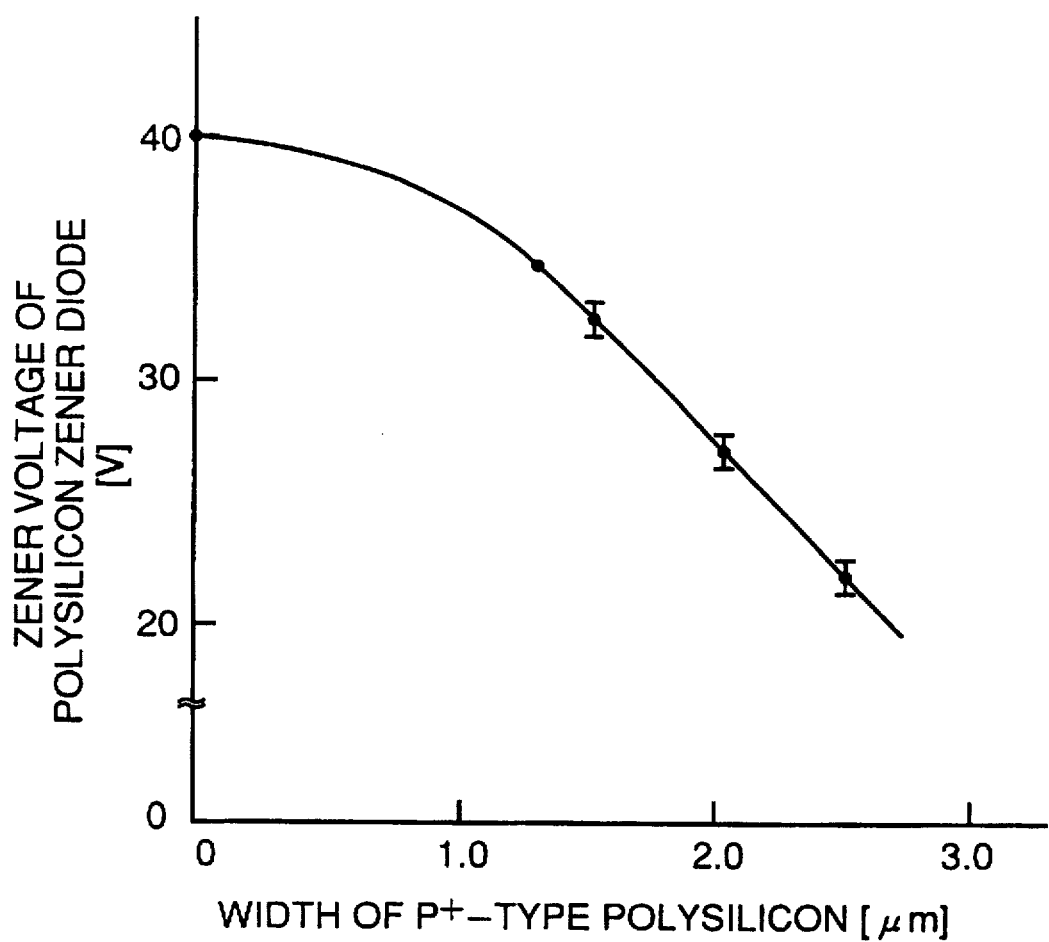
FIG. 8 is a graph showing the relationship between widths of a $P^+$-type polysilicon layer and Zener voltages in the semiconductor device of the second embodiment according to the invention.

FIG. 8 is a graph showing an example of the relationship between the width of the P⁺ region, that is, the width of the mask pattern used during the formation of the P⁺-type polysilicon, and the Zener voltage of the polysilicon Zener diode. As apparent from FIG. 8, it is possible to control the Zener voltage by over 20 V by varying the width of the P⁺ region between 0 and 3 μm.

As explained above, in the power MOSFET having a protection Zener diode between the source and the gate according to the invention, since the Zener diode has an $N^+/P/P^+/P/N^+$ structure, that is, the $P^+$ region of a high concentration is disposed between the P regions of a low concentration, the $P^+$ region serves as a channel stopper and prevents the occurrence of a leakage current between the gate and the source even when the surface of the P region has resulted in a condition prone to be inverted depending on the processes used subsequent to the formation of the Zener diode.

Also, since each of the $N^+$, P and $P^+$ regions is formed during the same process used for the MOSFET, whereas the Zener diode may be bound by certain designing restrictions if the importance is place in the characteristics of the MOSFET, it is possible to control the Zener voltage when necessary only by changing the width of the $P^+$ region without making any changes in the magnitude or concentration of each region of the $N^+/P/N^+$ structure as the parent material.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor device having a Zener diode disposed between a gate and a source of a MOS type semiconductor device, said Zener diode for protecting said gate, said Zener diode comprising:

a series of semiconductor junction structures comprising regions of a first conductive type and a second conductive type; and a channel stopper of said first conductive type disposed in a region of said first conductive type, said channel stopper suppressing a leakage current caused by an inversion of a surface of a region of said first conductive type.

2. A semiconductor device according to claim 1, in which said region of said first conductive type containing said channel stopper has a lower impurity concentration in comparison to that of said channel stopper which is disposed within said region of said first conductive type, said channel stopper partitioning said region of said first conductive type.

3. A semiconductor device according to claim 1, in which said series of semiconductor junction structures is disposed on an insulating film and is structured as $N^+/P/P^+/P/N^+$ with the $P^+$ being the channel stopper.

4. A semiconductor device according to claim 1, in which said region has an impurity concentration with which a Zener voltage of said Zener diode is controlled.

5. A semiconductor device according to claim 1, in which said channel stopper has a sufficient width with which to control a Zener voltage of said Zener diode.

6. A semiconductor device according to claim 1, in which said Zener diode constitutes a plurality of stages of Zener diode structures.

7. A semiconductor device according to claim 1, further comprising a plurality of said series of semiconductor junction structures and a plurality of said channel stoppers.

8. A method for fabricating a semiconductor device in which a Zener diode is connected between a gate and a source of a MOS type semiconductor device, said method comprising the steps of:

forming an epitaxial layer at a Zener diode formation region on a semiconductor substrate;

forming a conductive layer by forming a diffusion layer on said epitaxial layer, said conductive layer being formed over said diffusion layer with an insulating layer being interposed;

forming a semiconductor region of a first impurity concentration by converting said conductive layer;

forming a semiconductor region of a second impurity concentration in a portion of said semiconductor region of said first impurity concentration, said semiconductor region of said first impurity concentration having a lower concentration than said semiconductor region of said second impurity concentration, said semiconductor region of said second impurity concentration partitioning said semiconductor region of said first concentration; and forming, adjacent to said semiconductor region of said first impurity concentration, a semiconductor region of a conductivity type different from that of said semiconductor region of said first impurity concentration, thus forming junction structures having different impurity concentrations.

9. A method for fabricating a semiconductor device according to claim 7, in which said step of forming said semiconductor region of said first impurity concentration, said step of forming said semiconductor region of said second impurity concentration, and said step of forming said junction structures are each carried out during stages of forming a multi-layered diffusion layer constituting said MOS type semiconductor device in which said Zener diode is connected between said gate and said source.

* * * * *